United States Patent
Bongiovi et al.

(10) Patent No.: US 9,264,004 B2
(45) Date of Patent: Feb. 16, 2016

(54) SYSTEM AND METHOD FOR NARROW BANDWIDTH DIGITAL SIGNAL PROCESSING

(71) Applicants: Anthony Bongiovi, Port St Lucie, FL (US); Glenn Zelniker, Gainesville, FL (US); Joseph G. Butera, III, Stuart, FL (US)

(72) Inventors: Anthony Bongiovi, Port St Lucie, FL (US); Glenn Zelniker, Gainesville, FL (US); Joseph G. Butera, III, Stuart, FL (US)

(73) Assignee: Bongiovi Acoustics LLC, Port St. Lucie, FL (US)

( * ) Notice: Subject to any disclaimer, the term of this patent is extended or adjusted under 35 U.S.C. 154(b) by 172 days.

(21) Appl. No.: 14/032,347

(22) Filed: Sep. 20, 2013

(65) Prior Publication Data

US 2014/0369521 A1    Dec. 18, 2014

Related U.S. Application Data

(60) Provisional application No. 61/834,071, filed on Jun. 12, 2013.

(51) Int. Cl.
*H03G 5/00* (2006.01)
*H03G 3/00* (2006.01)
(Continued)

(52) U.S. Cl.
CPC ................. *H03G 3/00* (2013.01); *H03G 5/005* (2013.01); *H03G 9/005* (2013.01); *H03G 9/025* (2013.01)

(58) Field of Classification Search
CPC ............. H04R 3/04; H04R 3/14; H04R 3/12; H04R 1/26; H04R 5/02; H03G 5/04; H03G 5/10; H03G 5/00; H03G 5/06; H03G 5/165; H03G 5/025; H03G 5/005
USPC ...................................... 381/98–103
See application file for complete search history.

(56) References Cited

U.S. PATENT DOCUMENTS 4,162,462 A    7/1979    Endoh et al.
4,184,047 A    1/1980    Langford
(Continued)

FOREIGN PATENT DOCUMENTS

AU    2005274099    10/2010
AU    20070325096    4/2012
(Continued)

OTHER PUBLICATIONS

U.S. Appl. No. 12/648,007, filed Jul. 1, 2010, Bongiovi.
(Continued)

*Primary Examiner* — Simon Sing
(74) *Attorney, Agent, or Firm* — Malloy & Malloy, P.L.

(57) ABSTRACT

The present invention provides methods and systems for narrow bandwidth digital processing of an input audio signal. Particularly, the present invention includes a high pass filter configured to filter the input audio signal. A first compressor then modulates the filtered signal in order to create a partially processed signal. In some embodiments, a clipping module further limits the gain of the partially processed signal. A splitter is configured to split the partially processed signal into a first signal and a second signal. A low pass filter is configured to filter the first signal. A pass through module is configured to adjust the gain of the second signal. A mixer then combines the filtered first signal and the gain-adjusted second signal in order to output a combined signal. In some embodiments, a tone control module further processes the combined signal, and a second compressor further modulates the processed signal.

29 Claims, 8 Drawing Sheets

(51) Int. Cl.
*H03G 9/00* (2006.01)
*H03G 9/02* (2006.01)

(56) References Cited

U.S. PATENT DOCUMENTS

| | | | |
|---|---|---|---|
| 4,218,950 A | 8/1980 | Uetrecht | |
| 4,353,035 A | 10/1982 | Schroder | |
| 4,356,558 A | 10/1982 | Owen et al. | |
| 4,363,007 A | 12/1982 | Haramoto et al. | |
| 4,412,100 A | 10/1983 | Orban | |
| 4,517,415 A | 5/1985 | Laurence | |
| 4,538,297 A | 8/1985 | Waller | |
| 4,584,700 A | 4/1986 | Scholz | |
| 4,602,381 A | 7/1986 | Cugnini et al. | |
| 4,612,665 A | 9/1986 | Inami et al. | |
| 4,641,361 A | 2/1987 | Rosback | |
| 4,677,645 A | 6/1987 | Kaniwa et al. | |
| 4,696,044 A | 9/1987 | Waller, Jr. | |
| 4,701,953 A | 10/1987 | White | |
| 4,704,726 A | 11/1987 | Gibson | |
| 4,739,514 A | 4/1988 | Short et al. | |
| 4,815,142 A | 3/1989 | Imreh | |
| 4,856,068 A | 8/1989 | Quatieri et al. | |
| 4,887,299 A | 12/1989 | Cummins et al. | |
| 5,133,015 A | 7/1992 | Scholz | |
| 5,210,806 A | 5/1993 | Kihara et al. | |
| 5,239,997 A | 8/1993 | Guarino et al. | |
| 5,361,381 A * | 11/1994 | Short | 381/80 |
| 5,463,695 A | 10/1995 | Werrbach | |
| 5,465,421 A | 11/1995 | McCormick et al. | |
| 5,467,775 A | 11/1995 | Callahan et al. | |
| 5,541,866 A | 7/1996 | Sato | |
| 5,572,443 A | 11/1996 | Emoto et al. | |
| 5,617,480 A | 4/1997 | Ballard et al. | |
| 5,640,685 A | 6/1997 | Komoda | |
| 5,671,287 A | 9/1997 | Gerzon | |
| 5,699,438 A | 12/1997 | Smith et al. | |
| 5,727,074 A * | 3/1998 | Hildebrand | 381/103 |
| 5,737,432 A * | 4/1998 | Werrbach | 381/94.1 |
| 5,832,097 A | 11/1998 | Armstrong et al. | |
| 5,848,164 A | 12/1998 | Levine | |
| 5,872,852 A | 2/1999 | Dougherty | |
| 5,990,955 A | 11/1999 | Koz | |
| 6,078,670 A | 6/2000 | Beyer | |
| 6,108,431 A | 8/2000 | Bachler | |
| 6,201,873 B1 | 3/2001 | Dal Farra | |
| 6,263,354 B1 | 7/2001 | Gandhi | |
| 6,285,767 B1 | 9/2001 | Klayman | |
| 6,292,511 B1 | 9/2001 | Goldston et al. | |
| 6,317,117 B1 | 11/2001 | Goff | |
| 6,318,797 B1 | 11/2001 | Bohm et al. | |
| 6,518,852 B1 | 2/2003 | Derrick | |
| 6,535,846 B1 | 3/2003 | Shashoua | |
| 6,661,900 B1 | 12/2003 | Allred et al. | |
| 6,772,114 B1 | 8/2004 | Sluijter et al. | |
| 6,847,258 B2 * | 1/2005 | Ishida | H03F 3/604 330/124 R |
| 6,871,525 B2 | 3/2005 | Withnall et al. | |
| 6,907,391 B2 | 6/2005 | Bellora et al. | |
| 6,999,826 B1 | 2/2006 | Zhou et al. | |
| 7,006,653 B2 | 2/2006 | Guenther | |
| 7,016,746 B2 | 3/2006 | Wiser et al. | |
| 7,058,463 B1 | 6/2006 | Ruha et al. | |
| 7,123,728 B2 | 10/2006 | King et al. | |
| 7,254,243 B2 | 8/2007 | Bongiovi | |
| 7,266,205 B2 | 9/2007 | Miller | |
| 7,274,795 B2 | 9/2007 | Bongiovi | |
| 7,519,189 B2 | 4/2009 | Bongiovi | |
| 7,577,263 B2 | 8/2009 | Tourwe | |
| 7,613,314 B2 | 11/2009 | Camp, Jr. | |
| 7,676,048 B2 | 3/2010 | Tsutsui | |
| 7,778,718 B2 | 8/2010 | Janke et al. | |
| 7,916,876 B1 | 3/2011 | Helsloot | |
| 8,068,621 B2 | 11/2011 | Okabayashi et al. | |
| 8,160,274 B2 | 4/2012 | Bongiovi | |
| 8,175,287 B2 | 5/2012 | Ueno et al. | |
| 8,229,136 B2 | 7/2012 | Bongiovi | |
| 8,284,955 B2 | 10/2012 | Bongiovi et al. | |
| 8,462,963 B2 | 6/2013 | Bongiovi | |
| 8,472,642 B2 | 6/2013 | Bongiovi | |
| 8,565,449 B2 | 10/2013 | Bongiovi | |
| 8,705,765 B2 | 4/2014 | Bongiovi | |
| 2001/0008535 A1 | 7/2001 | Lanigan | |
| 2001/0043704 A1 * | 11/2001 | Schwartz | 381/98 |
| 2002/0057808 A1 | 5/2002 | Goldstein | |
| 2003/0023429 A1 | 1/2003 | Claesson | |
| 2003/0035555 A1 | 2/2003 | King et al. | |
| 2003/0043940 A1 | 3/2003 | Janky et al. | |
| 2003/0112088 A1 | 6/2003 | Bizjak | |
| 2003/0138117 A1 | 7/2003 | Goff | |
| 2003/0164546 A1 | 9/2003 | Giger | |
| 2003/0179891 A1 | 9/2003 | Rabinowitz et al. | |
| 2003/0216907 A1 | 11/2003 | Thomas | |
| 2004/0022400 A1 | 2/2004 | Magrath | |
| 2004/0044804 A1 | 3/2004 | Mac Farlane | |
| 2004/0086144 A1 | 5/2004 | Kallen | |
| 2004/0138769 A1 | 7/2004 | Akiho | |
| 2004/0146170 A1 | 7/2004 | Zint | |
| 2005/0090295 A1 | 4/2005 | Ali et al. | |
| 2005/0129248 A1 | 6/2005 | Kraemer et al. | |
| 2005/0175185 A1 * | 8/2005 | Korner | 381/61 |
| 2005/0201572 A1 | 9/2005 | Lindahl et al. | |
| 2005/0249272 A1 | 11/2005 | Kirkeby et al. | |
| 2005/0254564 A1 | 11/2005 | Tsutsui | |
| 2006/0034467 A1 | 2/2006 | Sleboda et al. | |
| 2006/0064301 A1 | 3/2006 | Aguilar et al. | |
| 2006/0098827 A1 | 5/2006 | Paddock et al. | |
| 2006/0126851 A1 | 6/2006 | Yuen et al. | |
| 2006/0126865 A1 | 6/2006 | Blamey et al. | |
| 2006/0140319 A1 | 6/2006 | Eldredge et al. | |
| 2006/0291670 A1 | 12/2006 | King et al. | |
| 2007/0010132 A1 | 1/2007 | Nelson | |
| 2007/0177459 A1 | 8/2007 | Behn | |
| 2007/0206643 A1 | 9/2007 | Egan | |
| 2007/0223713 A1 | 9/2007 | Gunness | |
| 2007/0223717 A1 | 9/2007 | Boersma | |
| 2007/0253577 A1 | 11/2007 | Yen et al. | |
| 2008/0031462 A1 | 2/2008 | Walsh et al. | |
| 2008/0040116 A1 | 2/2008 | Cronin | |
| 2008/0069385 A1 | 3/2008 | Revit | |
| 2008/0112576 A1 | 5/2008 | Bongiovi | |
| 2008/0123870 A1 | 5/2008 | Stark | |
| 2008/0123873 A1 | 5/2008 | Bjorn-Josefsen et al. | |
| 2008/0137881 A1 | 6/2008 | Bongiovi | |
| 2008/0165989 A1 | 7/2008 | Seil | |
| 2008/0181424 A1 | 7/2008 | Schulein et al. | |
| 2008/0219459 A1 | 9/2008 | Bongiovi et al. | |
| 2008/0255855 A1 | 10/2008 | Lee et al. | |
| 2009/0022328 A1 | 1/2009 | Neugebauer et al. | |
| 2009/0054109 A1 | 2/2009 | Hunt | |
| 2009/0062946 A1 | 3/2009 | Bongiovi et al. | |
| 2009/0086996 A1 | 4/2009 | Bongiovi et al. | |
| 2009/0290725 A1 | 11/2009 | Huang | |
| 2009/0296959 A1 | 12/2009 | Bongiovi | |
| 2010/0303278 A1 | 12/2010 | Sahyoun | |
| 2011/0013736 A1 | 1/2011 | Tsukamoto et al. | |
| 2011/0087346 A1 * | 4/2011 | Larsen et al. | 700/94 |
| 2011/0194712 A1 | 8/2011 | Potard | |
| 2012/0014553 A1 | 1/2012 | Bonanno | |
| 2012/0099741 A1 | 4/2012 | Gotoh et al. | |
| 2012/0170759 A1 | 7/2012 | Yuen | |
| 2012/0213034 A1 | 8/2012 | Imran | |
| 2012/0213375 A1 | 8/2012 | Mahabub et al. | |
| 2012/0302920 A1 | 11/2012 | Bridger et al. | |
| 2013/0121507 A1 | 5/2013 | Bongiovi et al. | |
| 2013/0162908 A1 | 6/2013 | Son et al. | |
| 2013/0227631 A1 | 8/2013 | Sharma et al. | |
| 2013/0242191 A1 | 9/2013 | Leyendecker | |
| 2013/0288596 A1 | 10/2013 | Suzuki et al. | |
| 2014/0100682 A1 | 4/2014 | Bongiovi | |
| 2014/0112497 A1 | 4/2014 | Bongiovi et al. | |
| 2014/0185829 A1 | 7/2014 | Bongiovi | |
| 2014/0379355 A1 | 12/2014 | Hosokawa | |

(56) References Cited

U.S. PATENT DOCUMENTS

FOREIGN PATENT DOCUMENTS

| | | |
|---|---|---|
| AU | 2012202127 | 7/2014 |
| CA | 2533221 | 6/1995 |
| CA | 2576829 | 7/2014 |
| CN | 203057339 | 7/2013 |
| EP | 0206746 B1 | 8/1992 |
| GB | 2003707 A | 3/1979 |
| ID | P0031074 | 6/2012 |
| IN | 260362 | 4/2014 |
| IS | 198914 | 7/2014 |
| JP | 7106876 | 4/1995 |
| KR | 10-2004-0022442 | 3/2004 |
| KR | 10-2009-0101209 | 9/2009 |
| NZ | 553744 | 1/2009 |
| NZ | 574141 | 4/2010 |
| NZ | 557201 | 5/2012 |
| PH | 12009501073 | 11/2014 |
| SG | 152762 | 12/2011 |
| SG | 155213 | 2/2013 |
| WO | WO 9311637 | 6/1993 |
| WO | WO 9535628 | 12/1995 |
| WO | WO 9938155 | 7/1999 |
| WO | WO 0015003 | 3/2000 |
| WO | WO 2006020427 | 2/2006 |
| WO | WO 2007092420 | 8/2007 |
| WO | WO 2008067454 | 6/2008 |
| WO | WO 2009070797 | 6/2009 |
| WO | WO 2009114746 | 9/2009 |
| WO | WO 2009155057 | 12/2009 |
| WO | WO 2010027705 | 3/2010 |
| WO | WO 2010051354 | 5/2010 |
| WO | WO 2011081965 | 7/2011 |
| WO | WO 2013076223 | 5/2013 |
| WO | WO 2015061393 | 4/2015 |
| WO | WO 2015077681 | 5/2015 |

OTHER PUBLICATIONS

U.S. Appl. No. 12/727,658, filed Sep. 22, 2011, Hicks et al.
NovaSound Int., http://www.novasoundint.com/new_page_t.htm, 2004.

* cited by examiner

SYSTEM AND METHOD FOR NARROW BANDWIDTH DIGITAL SIGNAL PROCESSING

CLAIM OF PRIORITY

The present application is based on and a claim of priority is made under 35 U.S.C. Section 119(e) to a provisional patent application that is currently pending in the U.S. Patent and Trademark Office, namely, that having Ser. No. 61/834,071 and a filing date of Jun. 12, 2013, and which is incorporated herein by reference.

FIELD OF THE INVENTION

The present invention provides for methods and systems for digitally processing narrow bandwidth digital signals. Specifically, some embodiments relate to digitally processing an audio signal where the audio content is restricted to only a few octaves.

BACKGROUND OF THE INVENTION

Narrow bandwidth audio processing has a variety of applications, including voice communications in extreme first responder environments, auscultation of various body sounds, hydrophones, telecommunications, or unusual speaker/microphone situations where the available information is of very poor quality. In these situations, the audio content is generally restricted to only a few octaves.

Although traditional, full spectrum audio enhancement systems and methods are capable of enhancing the sound quality of narrow bandwidth audio content, these standard configurations tend to be underutilized and fall short of achieving stellar quality enhancements. Accordingly, it would be beneficial to improve audio processing and enhancement for narrow bandwidth audio content throughout various applications, in order to produce a clear and easily interpretable audio output. Further, it would be beneficial to allow a user to calibrate the audio processing for different applications having different narrow bandwidth frequency ranges.

SUMMARY OF THE INVENTION

The present invention meets the existing needs described above by providing for a system and method for narrow bandwidth processing of an audio signal, in order to create a clear and easily interpretable audio output.

Accordingly, in initially broad terms, an audio input signal is first filtered through a high pass filter. The high pass filter may comprise a resonant high pass filter with a first frequency. As such, the frequencies of the audio input signal above the first frequency are passed through to a first compressor as a filtered signal. The first compressor comprises dynamic gain compression capabilities in order to modulate the filtered signal.

In some embodiments, the modulated signal is then transmitted to a clipping module in order to create a partially processed signal. The clipping module limits the gain of the modulated signal in order to create a partially processed signal. In other embodiments, the filtered signal from the first compressor is transmitted as the partially processed signal, without the use of a clipping module.

In some embodiments, the partially processed signal is sent to a transmitter for transmission to a receiver over a communications network, the receiver then transmits the partially processed signal to a splitter. In other embodiments, the partially processed signal is sent directly to the splitter without the use of a transmitter or receiver.

The partially processed signal is then split in the splitter into a first signal and a second signal. The first signal is then filtered through a low pass filter. The low pass filter may comprise a resonant low pass filter with a second frequency. The frequencies below the second frequency are passed through. In a preferred embodiment, and counterintuitive to expected function, the second frequency is selected to be lower than the first frequency. This allows the resultant signal to be used to rebuild usable dynamics from the low frequencies. The second signal is transmitted to a pass through module. The pass through module may be configured to adjust the gain of the second signal. The pass through module may simply pass through the second signal without any modification. Further, the gain adjustment may be a static adjustment. The filtered first signal and gain-adjusted are then combined in a mixer in order to create a combined signal.

In some embodiments, the combined signal is then processed by a tone control module. The tone control module may comprise a parametric equalizer or other equalizer configured to fine tune the signal. In at least one embodiment, the processed signal from the tone control module may then be modulated by a second compressor. The modulated signal is then sent as the output signal. In other embodiments, the combined signal from the mixer may be directly sent as the output signal, without the use of the tone control module or the second compressor.

Applications of the present invention may include voice communication, such as those in extreme first responder environments or where the available audio content is of poor or very poor quality. In these applications, the present invention may filter out background noise, and selectively enhance the frequency range of voice applications in order to yield a clear and interpretable audio output. In these embodiments, the first frequency may be selected from the range of 2.5 kHz to 3.2 kHz, and the second frequency may be selected from the range of 700 Hz to 1000 Hz.

Other applications may include hydrophones or sonar, such as those used for underwater or underground resource exploration, and appropriate frequency ranges for such applications. In body auscultations, the present invention may also be used to enhance respiratory sounds, for instance as part of an electronic stethoscope. The present invention may also be used to enhance heart sounds, for instance as part of a device for phonocardiogram or echocardiograph, as well as other detection methods. The present invention may also be embedded as part of, or connected to a computer in order to analyze pre-recorded narrow bandwidth audio content. Accordingly, the first and second frequency ranges, as well as gain control and compression elements, may be set or calibrated accordingly depending on the type of audio content.

These and other objects, features and advantages of the present invention will become clearer when the drawings as well as the detailed description are taken into consideration.

BRIEF DESCRIPTION OF THE DRAWINGS

For a fuller understanding of the nature of the present invention, reference should be had to the following detailed description taken in connection with the accompanying drawings in which.

Like reference numerals refer to like parts throughout the several views of the drawings.

DETAILED DESCRIPTION OF THE EMBODIMENT

As illustrated by the accompanying drawings, the present invention is directed to systems and methods for narrow bandwidth digital signal processing.

Figure 1:
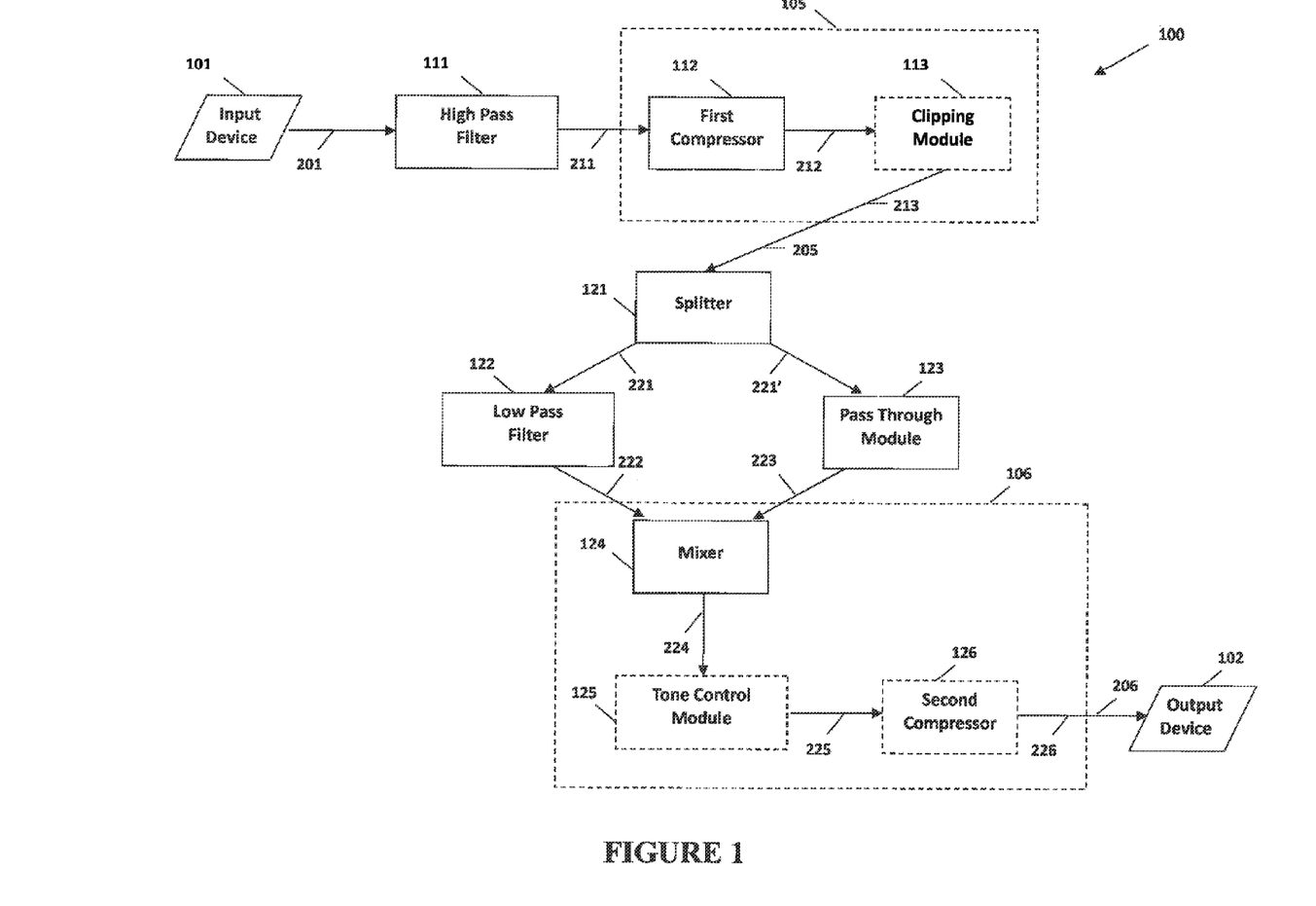
FIG. 1 illustrates a schematic of one embodiment of the present invention directed to a system for narrow bandwidth processing.

As schematically represented, FIG. 1 illustrates at least one preferred embodiment of a system 100 for narrow bandwidth digital signal processing. Accordingly, and in these embodiments, the system 100 generally comprises an input device 101, a high pass filter 111, a first processing module 105, a splitter 121, a resonant low pass filter 122, a pass through module 123, a second processing module 106, and finally an output device 102.

The input device 101 is at least partially structured or configured to transmit an input audio signal 201 into the high pass filter 111. The input audio signal 201 may comprise the full audible range, but will in certain applications comprise less than half of the 20 Hz to 20 kHz audible range. The input device 101 may comprise at least portions of an audio device capable of audio playback. The input device 101 for instance, may comprise a stereo system, a portable music player, a mobile device, a computer, a sound or audio card, or any other device or combination of electronic circuits suitable for audio playback.

The high pass filter 111 is configured to pass through high frequencies of the input audio signal 201, while attenuating lower frequencies, based on a first frequency. In other words, the frequencies above the first frequency are transmitted as a filtered signal 211 to the first compressor 112. In at least one embodiment, such as those for voice applications, the first frequency may be selected from a range between 2.5 kHz and 3.2 kHz. The first frequency however, may vary depending on the source signal. The first frequency may further be tunable by a user, or alternatively be statically set. The high pass filter 111 may comprise a resonant high pass filter. The high pass filter 111 may further comprise any circuits or combinations thereof structured to pass through high frequencies above a first frequency, and attenuate or filter out the lower frequencies.

The first processing module 105 is configured to process the filtered signal 211 and transmit a partially processed signal 205 to the splitter 121. Accordingly, the first processing module 105 may comprise a first compressor 112 in at least one embodiment. The first processing module 105 may also comprise both a first compressor 112 and a clipping module 113 in other embodiments.

In at least one embodiment, the first compressor 112 is configured to modulate the filtered signal 211 and transmit a modulated signal 212 to the clipping module 113. In other embodiments, the first compressor 112 may transmit the modulated signal 212 as the partially processed signal 205 to the splitter 121. The first compressor 112 may comprise an automatic gain controller. The first compressor 112 may comprise standard dynamic range compression controls such as threshold, ratio, attack and release. Threshold allows the first compressor 112 to reduce the level of the filtered signal 211 if its amplitude exceeds a certain threshold. Ratio allows the first compressor 112 to reduce the gain as determined by a ratio. Attack and release determines how quickly the first compressor 112 acts. The attack phase is the period when the first compressor 112 is decreasing gain to reach the level that is determined by the threshold. The release phase is the period that the first compressor 112 is increasing gain to the level determined by the ratio. The first compressor 112 may also feature soft and hard knees to control the bend in the response curve of the output or modulated signal 212, and other dynamic range compression controls appropriate for the dynamic compression of an audio signal. The first compressor 112 may further comprise any device or combination of circuits that is structured and configured for dynamic range compression.

The clipping module 113, in at least one embodiment, is configured to limit the gain of the modulated signal 212 and transmit a partially processed signal 213 to the splitter 121. Specifically, in at least one embodiment, the clipping module 113 is configured to limit or remove transients from the modulated signal 212. A transient is a short burst of gain or amplitude in the audio signal. Transients may be generated if, for instance, the first compressor used slower attack times in the creation of the modulated signal 212. This would ensure minimum dynamic range of the partially processed signal 213. A minimum dynamic range may further facilitate the transmission of a signal over a communication network due to its smaller bandwidth or file size. The clipping module 113 may comprise a clipper or clipping circuit. The clipping module 113 may comprise series clippers, shunt clippers, or any combination of circuits capable and appropriate for clipping or limiting amplitude or gain of an audio signal. Additionally, the clipping module 113 may also comprise soft clipping, or devices or circuits capable of soft clipping in order to avoid sharp points in the transfer characteristic of a signal.

The splitter 121 is configured to split the partially processed signal 213 into a first signal 221 and a second signal 221'. The first signal 221 is transmitted to a low pass filter 122, while the second signal 221' is transmitted to a pass through module 123. In at least one embodiment, the splitter 121 is configured such that the first signal 221 and second signal 221' are substantially the same signal as the partially processed signal 213, i.e. correspondingly identical amplitude and phase. In other embodiments, slight variations may result due to signal degradation.

The low pass filter 122 is configured to pass through low frequencies of the first signal 221, while attenuating higher frequencies, based on a second frequency. In other words, the frequencies below the second frequency are transmitted as a filtered first signal 222 to the mixer 124. In at least one embodiment, and counterintuitive to expected function, the second frequency is set below that of the first frequency. In voice applications the second frequency can be selected from a range between 700 Hz and 1000 Hz. The second frequency may further be tunable by a user, or alternatively be statically set. The resultant first filtered signal 222 is used to rebuild usable dynamics from the low frequencies.

The pass through module 123 is configured to pass through the second signal 221'. In at least one embodiment, the pass through module 123 will also adjust the gain of the second signal. For instance, in voice applications only a small amount of the signal is sufficient to achieve desired results, and the gain of the second signal 221' will be adjusted downward accordingly. One example of the pass through module 123 may be to restore sibilance in voice applications. Other examples may include the restoration of other high frequency content if the low pass filter 122 removes too much. In at least one embodiment, the level or gain adjustment of the pass through module 123 is a static adjustment. The gain adjustment may also be zero. In other embodiments, dynamic or adjustable gain reduction may be desired and used. In at least one embodiment, the pass through module may simply pass through a signal without any modification.

The second processing module 106 is configured to process the filtered first signal 222 and the gain-adjusted second signal 223 and transmit an output signal to the output device 102. Accordingly, the second processing module 106 may comprise a mixer 124, a tone control module 125, a second compressor 126, and any combinations thereof.

The mixer 124 is configured to combine the filtered first signal 222 and the gain-adjusted second signal 223 and transmit a combined signal 224 to the tone control module 125 in at least one embodiment. In some embodiments the combined signal 224 is transmitted as the output signal 206 of the second processing module 106. In other embodiments the combined signal 224 is further transmitted to a tone control module 125. The mixer 124 may comprise an electronic mixer structured to combine two or more signals into a composite or combined signal. The mixer 124 may similarly comprise any circuit or combination of circuits structured or configured to combine two or more signals.

The tone control module 125 processes the combined signal 224 and transmits a controlled signal 225 to the second compressor 126 in at least one embodiment. In some embodiments the controlled signal 225 is transmitted as the output signal 206, in other embodiments the controlled signal 225 is further transmitted to the second compressor 126. In at least one embodiment, the tone control module 125 comprises a parametric equalizer. Further, the parametric equalizer may comprise one, two, three, or four bands. In other embodiments, the tone control module 125 may comprise a graphic equalizer. The tone control module 125 may further be any device or combination of circuits appropriate for the equalization of an audio signal.

The second compressor 126, in at least one embodiment, is configured to modulate the controlled signal 225 and transmit an output signal 226 to the output device 102. The second compressor 126 may be similar in structure and/or configuration as the first compressor 112. Accordingly, the second compressor 126 may comprise any device or combination of circuits that is structured and configured for dynamic range compression or static compression or level adjustment.

The output device 102 may be structured to further process the output signal 226. The output device 102 may also be structured and/or configured for playback of the output signal 226.

Figure 2:
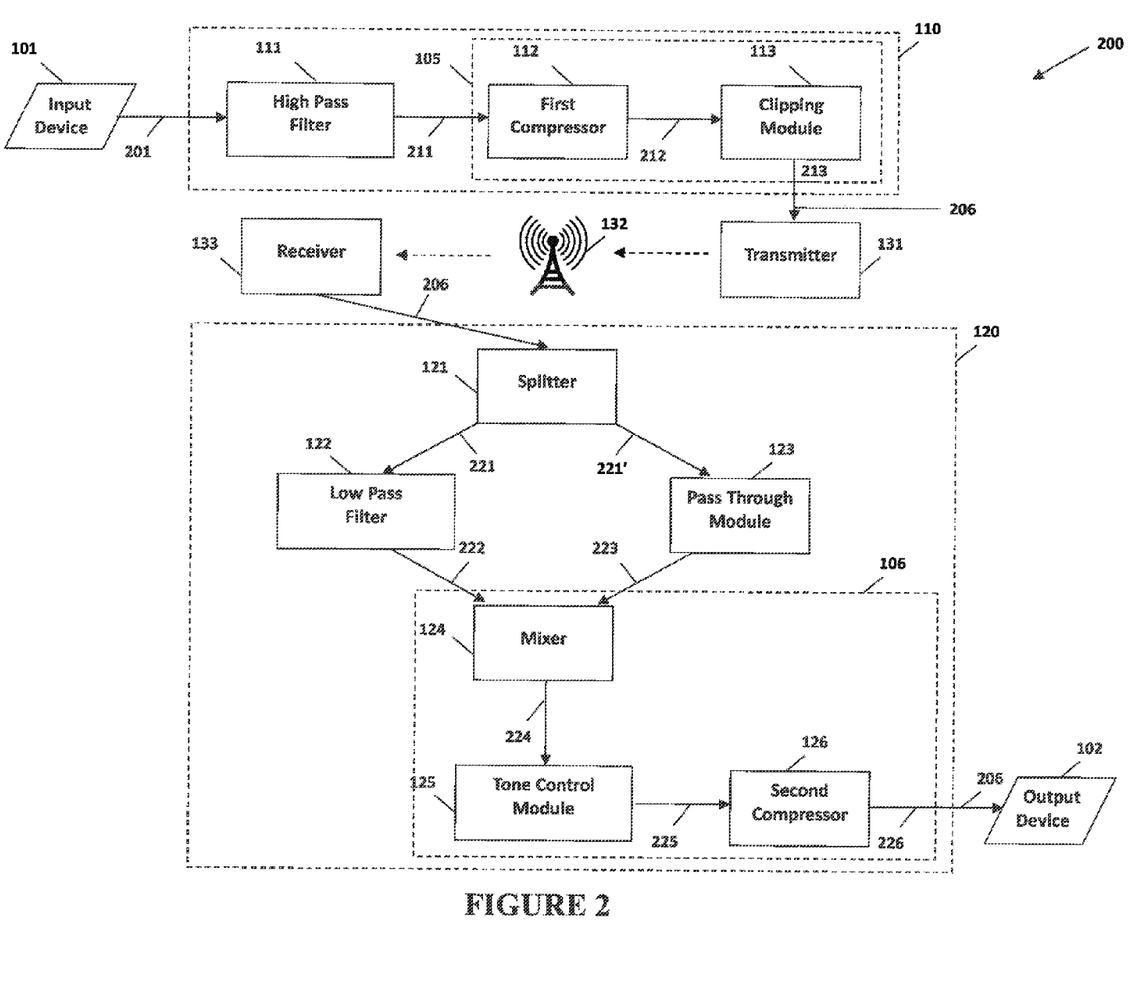
FIG. 2 illustrates a schematic of another embodiment of the present invention directed to a broadcast variation of the system of FIG. 1.

As schematically represented, FIG. 2 illustrates at least one preferred embodiment of a system 100 for narrow bandwidth digital signal processing in broadcasting applications. Accordingly, and in these embodiments, the system 200 generally comprises the same or similar components as system 100 as illustrated in FIG. 1, namely an input device 101, a high pass filter 111, a first compressor 112, a clipping module 113, a splitter 121, a resonant low pass filter 122, a pass through module 123, a mixer 124, a tone control module 125, a second compressor 126, and an output device 102. In the broadcasting embodiment of FIG. 2 as illustrated by system 200, these components may be split between a pre-transmission module 110 and a post-transmission module 120. Accordingly, the system 200 includes the addition of a transmitter 131, a communications network 132, and a receiver 133 in between the pre-transmission module 110 and post-transmission module 120.

In effect, the embodiment of system 200 separates out various components of the present invention into at least two modules, such that the pre-transmission module or modules 110 and post-transmission module or modules 120 may be placed in different locations or embedded into different devices in communication with one another. The network 132 may comprise a wired or wireless network, such as cellular, satellite, terrestrial, and any variety of LAN, WAN, local wireless or near field communications including but not limited to Wifi, Bluetooth, infrared technologies, as well as any other appropriate technologies for the transmission of a digital audio signal. Accordingly, the transmitter 131 and corresponding receiver 133 are configured to send and receive the partially processed signal 213 from the pre-transmission module 110 to the post-transmission module 120. In the embodiment of FIG. 2, the partially processed signal 213 is transmitted from the clipping module 113 to the transmitter 131, sent over the network 132 to the receiver 133, and then is transmitted to the splitter 121.

Figure 3:
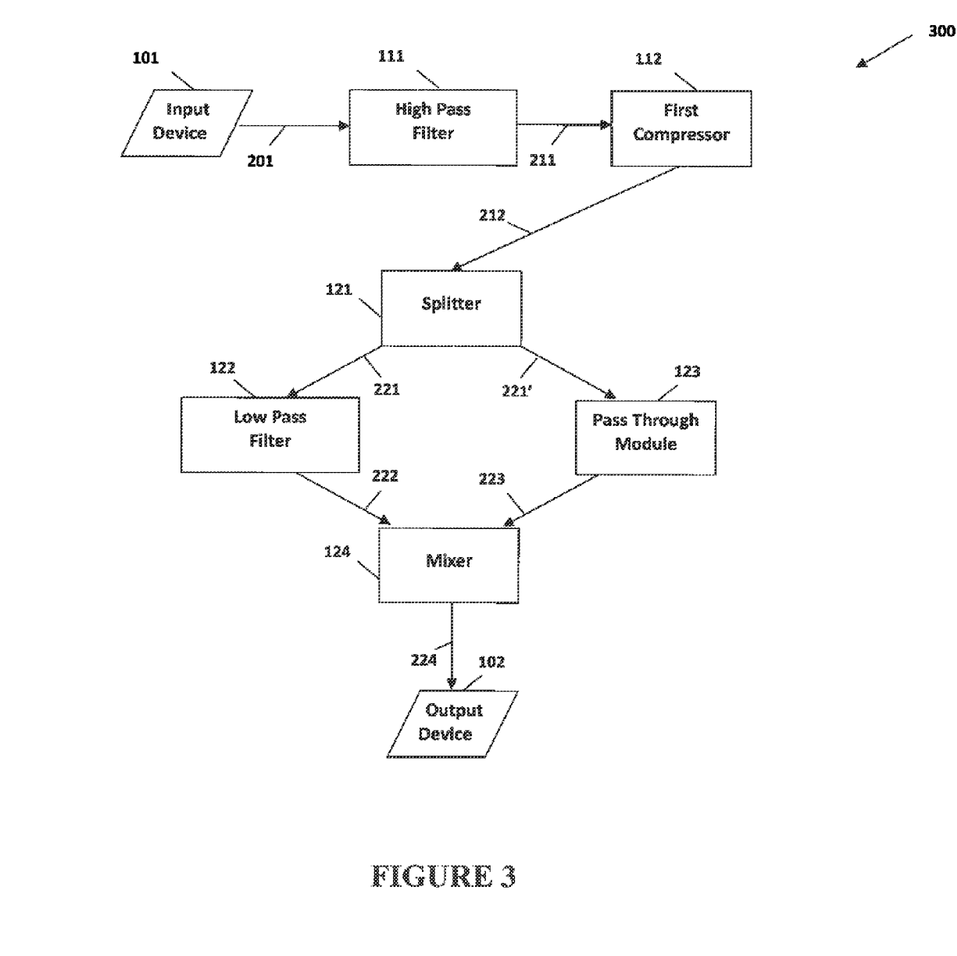
FIG. 3 illustrates a schematic of another embodiment of the present invention directed to a system for narrow bandwidth processing.

As schematically represented, FIG. 3 illustrates at least one preferred embodiment of a system 300 for narrow bandwidth digital signal processing. Generally speaking, the system 300 is a simpler variation of the embodiment of system 100, and has fewer components than the system 100 recited above. As such, the system 300 comprises an input device 101, a high pass filter 111, a first compressor 112, a splitter 121, a low pass filter 122, a pass through module 123, a mixer 124, and an output device 102. However, it should be understood that the system 300 embodiment may comprise the addition of the clipping module 113, tone control module 125, second compressor 126, and any combinations thereof.

Structurally and in at least one embodiment, the components recited in system 300 are similar to or the same as the components in system 100 above. Modulated signal 212 from the first compressor 112 however, is transmitted directly to the splitter 121. Further, the combined signal 224 from mixer 124 is sent directly to the output device 102.

Figure 4:
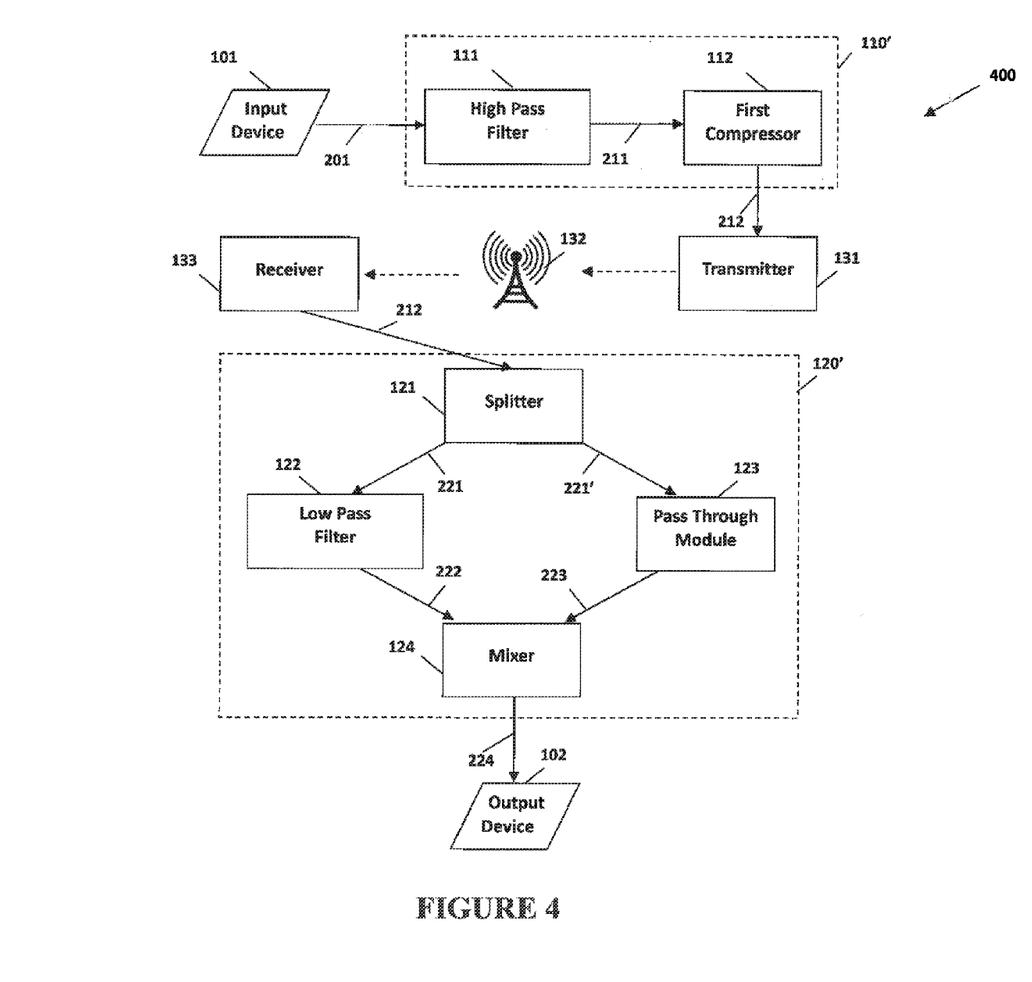
FIG. 4 illustrates a schematic of another embodiment of the present invention directed to a broadcast variation of the system of FIG. 3

As schematically represented, FIG. 4 illustrates at least one preferred embodiment of a broadcast variation of the system of FIG. 3. In this embodiment, system 400 comprises a pre-transmission module 110' and a post-transmission module 120'. The pre-transmission module 110' comprises a high pass filter 111 and a first compressor 112. The post-transmission module 120' comprises a splitter 121, a low pass filter 122, a pass through module 123, and a mixer 124. Structurally, the components are as those recited in system 300 and system 200 above in at least one embodiment.

Figure 5:
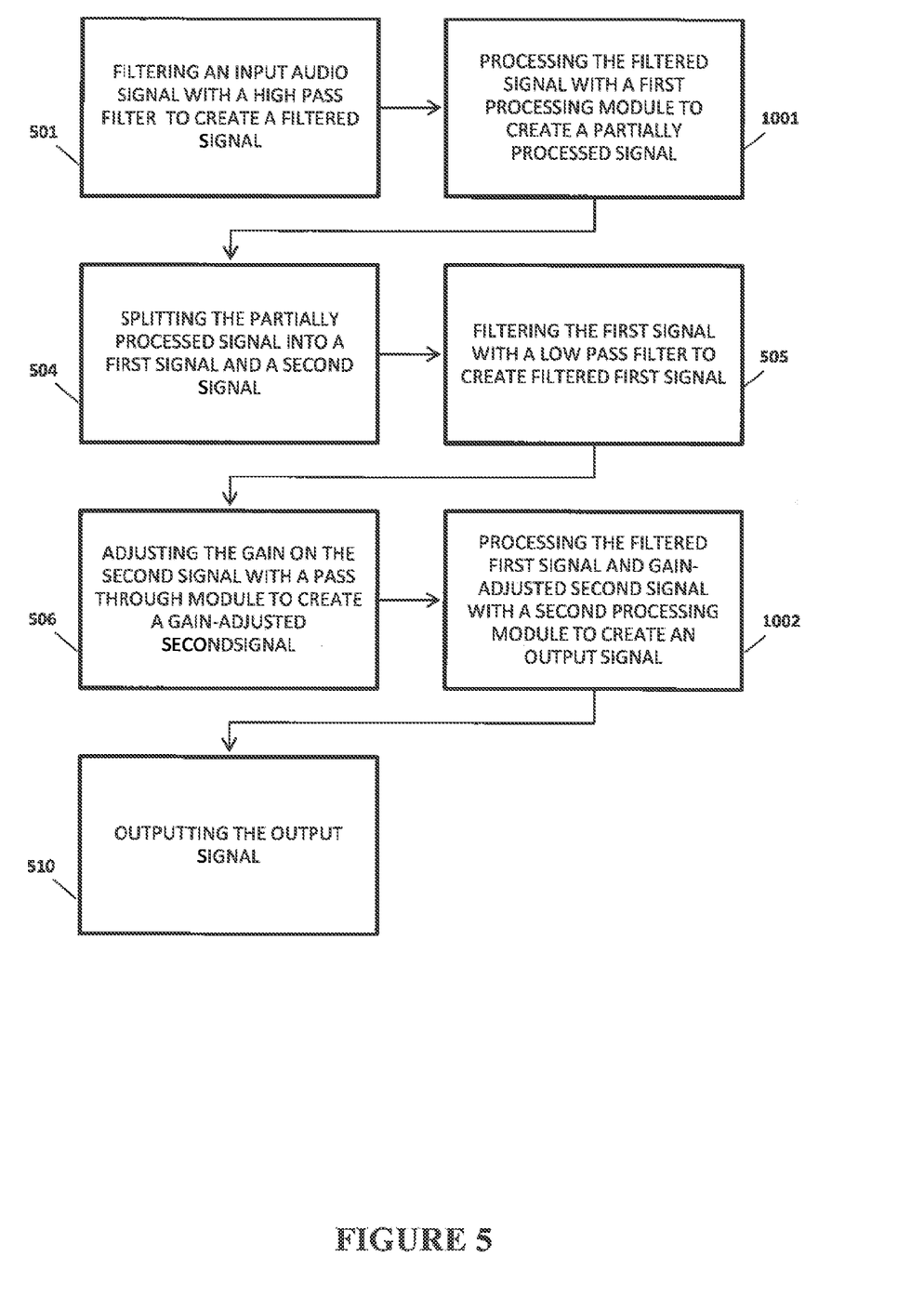
FIG. 5 illustrates a block diagram of another embodiment of the present invention directed to a method for narrow bandwidth processing.

As diagrammatically represented, FIG. 5 illustrates another embodiment directed to a method for narrow bandwidth processing, which may, in various embodiments, incorporate the components from the systems referenced above. In this embodiment, an input audio signal is first filtered, as in 501, with a high pass filter. In at least one embodiment, the high pass filter comprises a resonant filter that passes frequencies above a first frequency and attenuates frequencies below the first frequency. Further, the first frequency may be selected from a range between 2.5 kHz and 3.2 kHz.

The filtered signal comprising frequencies above the first frequency are then processed by the first processing module, as in 1001, to create a partially processed signal. This step may further comprise modulating the filtered signal with a first compressor to create a modulated signal. The first compressor may comprise an automatic gain controller, or other device or combination of circuits capable of dynamic range compression. In some embodiments, the first compressor may comprise any device or combination of circuits capable of static level adjustments. The modulated signal may be transmitted as the partially processed signal, or may further be transmitted to a clipping module to limit the gain of the modulated signal in order to create the partially processed signal. The clipping module may comprise a clipper or clipping circuit configured to limit the amplitude or gain of an audio signal. The clipping module may further comprise soft clipping in order to avoid sharp points in the transfer characteristics of the signal.

The partially processed signal is then split using a splitter, as in 504, into a first signal and a second signal. In at least one embodiment, the splitter is configured such that the first and second signals are substantially the same signal as the partially processed signal. In other words, the partially processed signal diverges into a first signal and a second signal at the splitter.

The first signal is filtered, as in 505, with a low pass filter. In at least one embodiment, the low pass filter comprises a resonant filter that passes frequencies below a second frequency and attenuates frequencies above the second frequency. Further, and counterintuitive to expected function, the second frequency is set to be lower than the first frequency. In at least one embodiment, the second frequency may further be selected from the range between 700 Hz and 1000 Hz.

The second signal is passed through the pass through module, as in 506. The gain of the second signal is adjusted in at least one embodiment. The gain adjustment may be zero, may be adjusted downwards or upwards. In some embodiments the gain adjustment may be static, in others dynamic. In yet other embodiments, the pass through module may not comprise a gain adjustment component. Accordingly, the pass through module may comprise a device or circuit(s) for the dynamic or static gain adjustment of the signal.

The filtered first signal and gain-adjusted second signal are then processed with a second processing module, as in 1002. This step may further comprise combining the filtered first signal and the gain-adjusted second signal with a mixer in order to create a combined signal. The mixer is structured and/or configured to combine at least two signals and output a composite signal. The combined signal may be transmitted as the output signal, or may be further processed with a tone control module to create a controlled signal. The tone control module may comprise any device or combination of circuits appropriate for the equalization of an audio signal. In at least one embodiment, the tone control module comprises a parametric equalizer. The parametric equalizer may comprise one, two, three, or four bands. In other embodiments, the tone control module may comprise graphic equalizers or other equalizers. The controlled signal may be output as the output signal, or may be further modulated with a second compressor to create the output signal. The second compressor may comprise any device or combination of circuits capable of dynamic range compression or static compression.

Finally, the output signal is transmitted to an output device, as in 510. The output device may be configured for additional processing, or may be configured for playback of the output signal.

Figure 6:
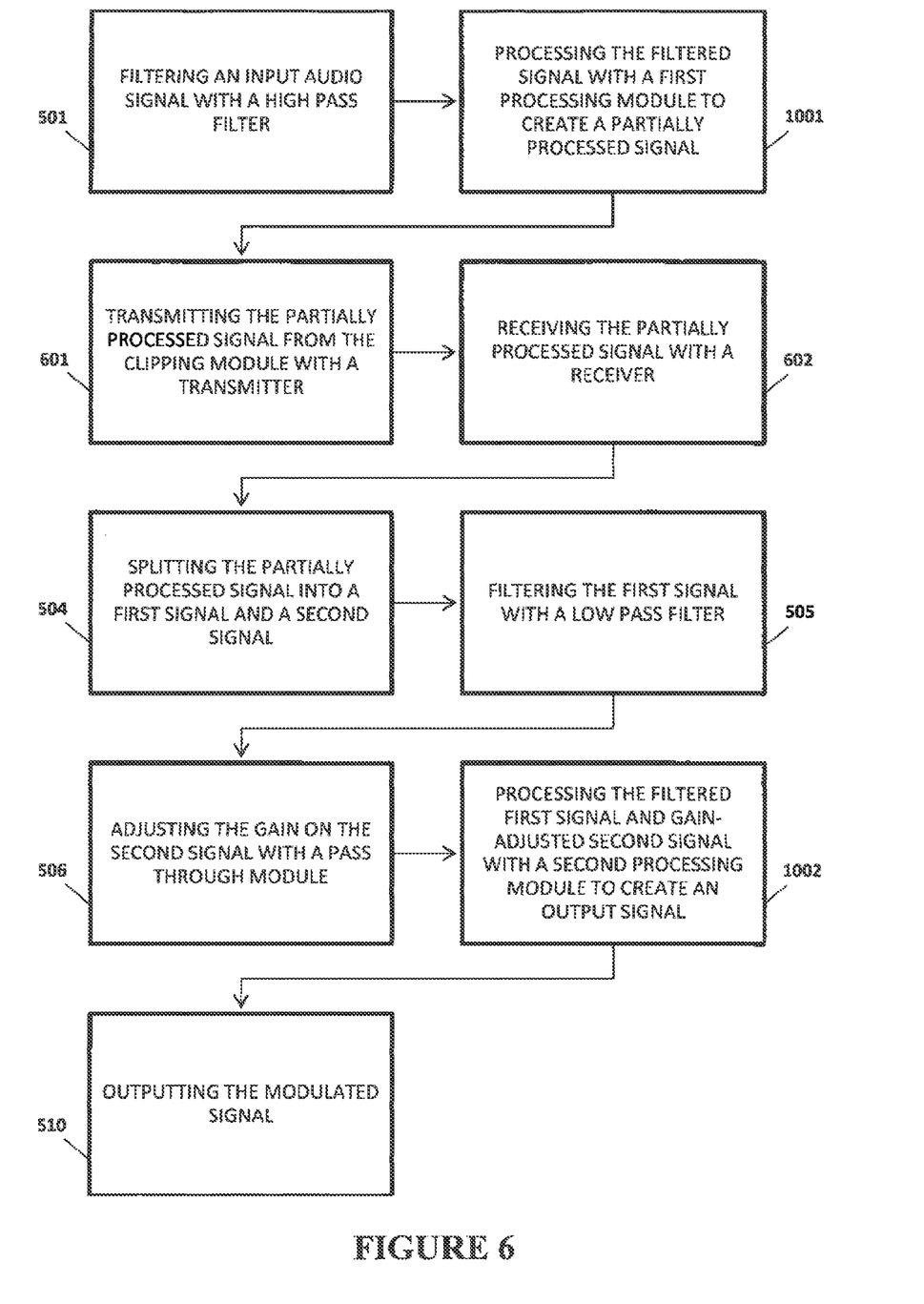
FIG. 6 illustrates a block diagram of another embodiment directed to a broadcast variation for the method of FIG. 5.

As diagrammatically represented, FIG. 6 illustrates another embodiment directed to a broadcasting variation of a method for narrow bandwidth processing. Structural and or configurable components of this embodiment may be the same or similar as those recited above.

In the embodiment of FIG. 6, an input audio signal is filtered, as in 501, with a high pass filter. In at least one embodiment, the high pass filter comprises a resonant filter that passes frequencies above a first frequency and attenuates frequencies below the first frequency. Further, the first frequency may be selected from a range between 2.5 kHz and 3.2 kHz.

The filtered signal is then processed by the first processing module, as in 1001. This step may comprise modulation by a first compressor, limiting the gain with a clipping module, or combinations thereof, in order to create a partially processed signal.

The partially processed signal is then transmitted with a transmitter, as in 601. The transmitter may comprise any device or combination of circuits capable of transmitting a signal, wired or wireless, over a communication network or platform. The partially processed signal is received with a receiver, as in 602. The receiver may comprise any device or combination of circuits capable of receiving the partially processed signal being transmitted by the transmitter.

The partially processed signal received by the receiver is then split into a first signal and second signal, as in 504, with a splitter.

The first signal is filtered with a low pass filter, as in 505. In at least one embodiment, the low pass filter comprises a resonant filter that passes frequencies below a second frequency and attenuates frequencies above the second frequency. Further, and counterintuitive to expected function, the second frequency is set to be lower than the first frequency. In at least one embodiment, the second frequency may further be selected from the range between 700 Hz and 1000 Hz.

The second signal is passed through a pass through module, as in 506. In at least one embodiment, the gain of the second signal is adjusted with the pass through module.

The filtered first signal and gain-adjusted second signal are then processed with a second processing module, as in 1002. This step may comprise combination of the two signals with a mixer, further processing with a tone control module, modulating with a second compressor, and combinations thereof, in order to create the output signal. Finally, the second processing module transmits an output signal as in 510 to the output device.

Figure 7:
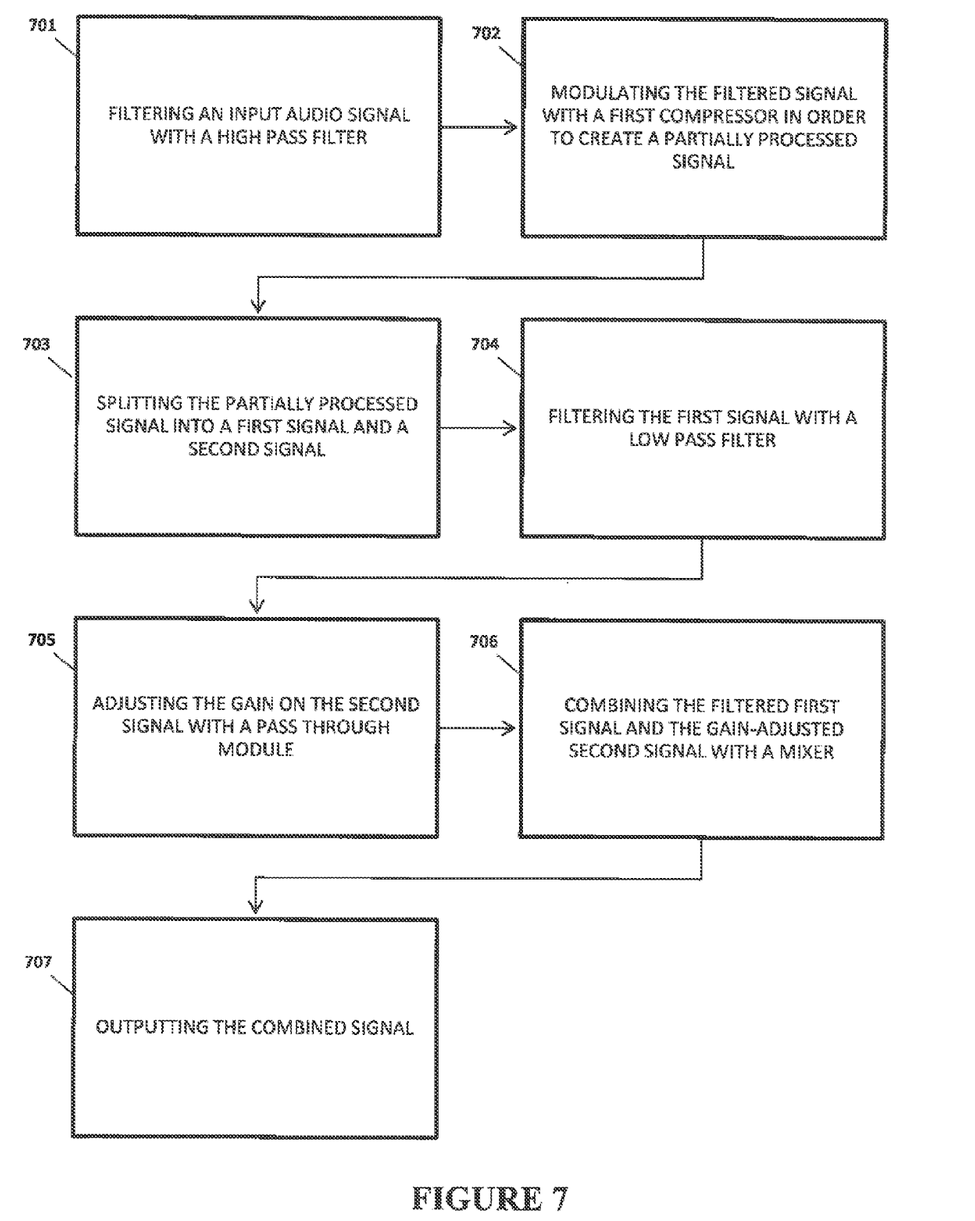
FIG. 7 illustrates a block diagram of another embodiment of the present invention directed to a method for narrow bandwidth processing.

As diagrammatically represented, FIG. 7 illustrates another embodiment directed to a method for narrow bandwidth processing. Structural and or configurable components of this embodiment may be the same or similar as those recited above. In the embodiment of FIG. 7, an input audio signal is filtered, as in 701, with a high pass filter. In at least one embodiment, the high pass filter comprises a resonant filter that passes frequencies above a first frequency and attenuates frequencies below the first frequency. Further, the first frequency may be selected from a range between 2.5 kHz and 3.2 kHz.

The filtered signal is then modulated by a first compressor, as in 702, in order to create a partially processed signal. The partially processed signal is then split into a first signal and second signal, as in 703, with a splitter.

The first signal is filtered with a low pass filter, as in 704. In at least one embodiment, the low pass filter comprises a resonant filter that passes frequencies below a second frequency and attenuates frequencies above the second frequency. Further, and counterintuitive to expected function, the second frequency is set to be lower than the first frequency. In at least one embodiment, the second frequency may further be selected from the range between 700 Hz and 1000 Hz.

The second signal is passed through a pass through module, as in 705. In at least one embodiment, the gain of the second signal is adjusted with the pass through module. The filtered first signal and gain-adjusted second signal are combined in a mixer, as in 706. Finally, the combined signal is transmitted as an output signal, as in 707.

Figure 8:
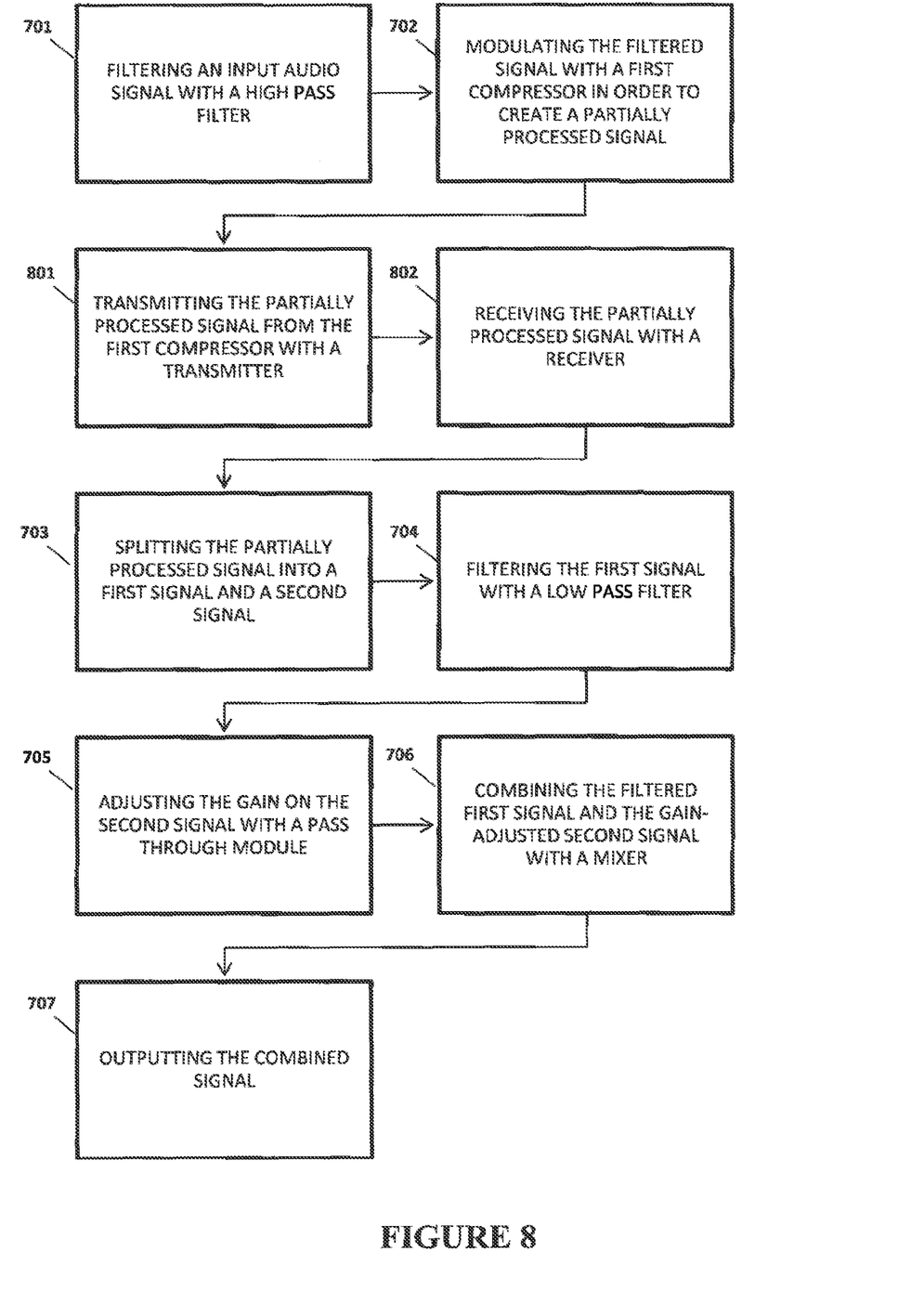
FIG. 8 illustrates a block diagram of another embodiment directed to a broadcast variation for the method of FIG. 7.

As diagrammatically represented, FIG. 8 illustrates another embodiment directed to a broadcasting variation of a method for narrow bandwidth processing. Structural and or configurable components of this embodiment may be the same or similar as those recited above.

In the embodiment of FIG. 8, an input audio signal is filtered, as in 701, with a high pass filter. In at least one embodiment, the high pass filter comprises a resonant filter that passes frequencies above a first frequency and attenuates frequencies below the first frequency. Further, the first frequency may be selected from a range between 2.5 kHz and 3.2 kHz. The filtered signal is then modulated by a first compressor, as in 702, in order to create a partially processed signal.

The partially processed signal is then transmitted with a transmitter, as in 801. The transmitter may comprise any device or combination of circuits capable of transmitting a signal, wired or wireless, over a communication network or platform. The partially processed signal is received with a receiver, as in 802. The receiver may comprise any device or combination of circuits capable of receiving the partially processed signal being transmitted by the transmitter.

The partially processed signal received by the receiver is then split into a first signal and second signal, as in 703, with a splitter.

The first signal is filtered with a low pass filter, as in 704. In at least one embodiment, the low pass filter comprises a resonant filter that passes frequencies below a second frequency and attenuates frequencies above the second frequency. Further, and counterintuitive to expected function, the second frequency is set to be lower than the first frequency. In at least one embodiment, the second frequency may further be selected from the range between 700 Hz and 1000 Hz.

The second signal is passed through a pass through module, as in 705. In at least one embodiment, the gain of the second signal is adjusted with the pass through module. The filtered first signal and gain-adjusted second signal are combined in a mixer, as in 706. Finally, the combined signal is transmitted as an output signal, as in 707.

The above methods may be completed in sequential order in at least one embodiment, though they may be completed in any other order. In at least one embodiment, the above methods may be exclusively performed, but in other embodiments, one or more steps of the methods as described may be skipped.

Since many modifications, variations and changes in detail can be made to the described preferred embodiment of the invention, it is intended that all matters in the foregoing description and shown in the accompanying drawings be interpreted as illustrative and not in a limiting sense. Thus, the scope of the invention should be determined by the appended claims and their legal equivalents.

Now that the invention has been described,

What is claimed is:

1. A system for narrow bandwidth digital signal processing of an input audio signal comprising:
    a high pass filter configured to filter the input audio signal to create a filtered signal,
    a first processing module configured to process the filtered signal to create a partially processed signal,
    a splitter configured to split the partially processed signal into a first signal and a second signal,
    a low pass filter configured to filter the first signal,
    a pass through module configured to adjust the gain of the second signal, and
    a second processing module configured to process the filtered first signal and gain-adjusted second signal to create an output signal, wherein said second processing module comprises:
        a mixer configured to combine the filtered first signal and gain adjusted second signal in order to create a combined signal;
        a tone control module configured to process the combined signal in order to create a controlled signal; and
        a second compressor configured to modulate the controlled signal to create the output signal.

2. A system as recited in claim 1 wherein the first processing module comprises a first compressor configured to modulate the filtered signal to create the partially processed signal.

3. A system as recited in claim 1 wherein the first processing module comprises a first compressor configured to modulate the filtered signal to create a modulated signal; a clipping module configured to adjust the gain of the modulated signal to create the partially processed signal.

4. A system as recited in claim 1 wherein said high pass filter is configured to filter the input audio signal based on a first frequency.

5. A system as recited in claim 4 wherein said first frequency is tunable.

6. A system as recited in claim 4 wherein said first frequency is selected from the range between 2.5 kHz and 3.2 kHz.

7. A system as recited in claim 1 wherein said low pass filter is configured to filter the first signal based on a second frequency.

8. A system as recited in claim 7 wherein said second frequency is tunable.

9. A system as recited in claim 7 wherein said second frequency is lower than said first frequency.

10. A system as recited in claim 7 wherein said second frequency is selected from the range between 700 Hz and 1000 Hz.

11. A system as recited in claim 1 wherein said tone control module comprises a parametric equalizer.

12. A system for narrow bandwidth digital signal processing of an input audio signal comprising:
    a pre-transmission module configured to receive the input audio signal and create a partially processed signal, wherein said pre-transmission module comprises:
        a high pass filter configured to filter the input audio signal to create a filtered signal,
        a first processing module configured to process the filtered signal to create the partially processed signal,
    a transmitter structured to transmit the partially processed signal,
    a receiver structured to receive the partially processed signal, and a post-transmission module configured to further process the partially processed signal to create an output signal, wherein said post-transmission module comprises:
  a splitter configured to split the received signal into a first signal and a second signal,
  a low pass filter configured to filter the first signal to create a filtered first signal,
  a pass through module configured to adjust the gain of the second signal to create a gain-adjusted second signal,
  a second processing module configured to process the filtered first signal and gain-adjusted second signal to create the output signal, wherein said second processing module comprises:
    a mixer configured to combine the filtered first signal and gain-adjusted second signal to create a combined signal;
    a tone control module configured the process the combined signal to create a controlled signal; and
    a second compressor configured to modulate the controlled signal to create the output signal.

13. A system as recited in claim 12 wherein the first processing module comprises a first compressor configured to modulate the filtered signal to create the partially processed signal.

14. A system as recited in claim 12 wherein the first processing module comprises a first compressor configured to modulate the filtered signal to create a modulated signal; a clipping module configured to adjust the gain of the modulated signal to create the partially processed signal.

15. A system as recited in claim 12 wherein said high pass filter is configured to filter the input audio signal based on a first frequency.

16. A system as recited in claim 15 wherein said first frequency is selected from the range between 2.5 kHz and 3.2 kHz.

17. A system as recited in claim 12 wherein said low pass filter is configured to filter the first signal based on a second frequency.

18. A system as recited in claim 17 wherein said second frequency is lower than said first frequency.

19. A system as recited in claim 17 wherein said second frequency is selected from the range between 700 Hz and 1000 Hz.

20. A method for narrow bandwidth digital signal processing of an input audio signal comprising:
  filtering the input audio signal with a high pass filter to create a filtered signal,
  processing the filtered signal with a first processing module to create a partially processed signal,
  splitting the partially processed signal into a first signal and a second signal,
  filtering the first signal with a low pass filter to create a filtered first signal,
  adjusting the gain on the second signal with a pass through module to create a gain-adjusted second signal,
  processing the filtered first signal and gain-adjusted second signal with a second processing module to create an output signal,
  wherein the processing the filtered first signal and gain adjusted second signal comprises:
    combining the filtered first signal and gain-adjusted second signal with a mixer to create a combined signal;
    processing the combined signal with a tone control module to create a controlled signal; and
    modulating the controlled signal with a second compressor to create the output signal.

21. A method as recited in claim 20 further comprising: transmitting the partially processed signal from the first processing module with a transmitter; receiving the partially processed signal with a receiver in communication with the splitter.

22. A method as recited in claim 20 wherein processing the filtered signal with a first processing module further comprises modulating the filtered signal with a first compressor to create the partially processed signal.

23. A method as recited in claim 20 wherein processing the filtered signal with a first processing module further comprises: modulating the filtered signal with a first compressor; limiting the gain of the modulated signal with a clipping module to create the partially processed signal.

24. A method as recited in claim 20 wherein the high pass filter is configured to filter the input audio signal based on a first frequency.

25. A method as recited in claim 24 wherein the first frequency is selected from the range between 2.5 kHz and 3.2 kHz.

26. A method as recited in claim 20 wherein the low pass filter is configured to filter the first signal based on a second frequency.

27. A method as recited in claim 26 wherein the second frequency is lower than the first frequency.

28. A method as recited in claim 26 wherein the second frequency is selected from the range between 700 Hz and 1000 Hz.

29. A system for narrow bandwidth digital signal processing of an input audio signal comprising:
  a high pass filter configured to filter the input audio signal to create a filtered signal,
  a first processing module configured to process the filtered signal to create a partially processed signal, wherein said first processing module comprises a first compressor configured to modulate the filtered signal to create the partially processed signal,
  a splitter configured to split the partially processed signal into a first signal and a second signal,
  a low pass filter configured to filter the first signal,
  a pass through module configured to adjust the gain of the second signal, and
  a second processing module configured to process the filtered first signal and gain-adjusted second signal to create an output signal, wherein said second processing module comprises a mixer configured to combine the filtered first signal and gain-adjusted second signal to create the output signal.

* * * * *